United States Patent [19]
Miki

[11] Patent Number: 5,895,958
[45] Date of Patent: Apr. 20, 1999

[54] INPUT PROTECTION CIRCUIT FOR USE IN SEMICONDUCTOR DEVICE HAVING AN IMPROVED ELECTROSTATIC BREAKDOWN VOLTAGE

[75] Inventor: Atsunori Miki, Tokyo, Japan

[73] Assignee: NEC Corporation, Tokyo, Japan

[21] Appl. No.: 08/668,908

[22] Filed: Jun. 24, 1996

[30] Foreign Application Priority Data

Jun. 22, 1995 [JP] Japan ................................. 7-155821

[51] Int. Cl.$^6$ ........................... H01L 29/90; H01L 27/04
[52] U.S. Cl. ........................ 257/355; 257/356; 257/357; 257/358; 257/359; 257/361; 257/363; 361/90; 361/94; 361/101; 361/196; 361/207
[58] Field of Search ........................ 257/355, 356, 257/357, 358, 359, 361, 363; 361/90, 94, 101, 196, 207

[56] References Cited

U.S. PATENT DOCUMENTS 4,602,267   7/1986   Shirato ................................. 257/358

FOREIGN PATENT DOCUMENTS 3-120751   5/1991   Japan.

Primary Examiner—Minh-Loan Tran
Assistant Examiner—Fetsum Abraham
Attorney, Agent, or Firm—Sughrue, Mion, Zinn, Macpeak & Seas, PLLC

[57] ABSTRACT

In an input protection circuit, a bipolar protection device is constituted of a semiconductor substrate of a first conductivity type, a first diffused layer of a second conductivity type formed in the substrate and connected to an input signal pad, a second diffused layer of the second conductivity type formed in the substrate to extend in parallel to the first diffused layer but separately from the first diffused layer by a first space, and a third diffused layer of a high impurity concentration and of the first conductivity type formed in the first space in the substrate to extend in parallel to the first and second diffused layers, in junction with the second diffused layer but separately from the first diffused layer. When a backward biasing voltage is applied, the thickness of a depletion layer formed is made large, so that generation of hot carriers is minimized. Thus, increase of a leakage current caused because hot carriers generated by application of an overvoltage were injected into a field oxide film, can be prevented.

8 Claims, 12 Drawing Sheets

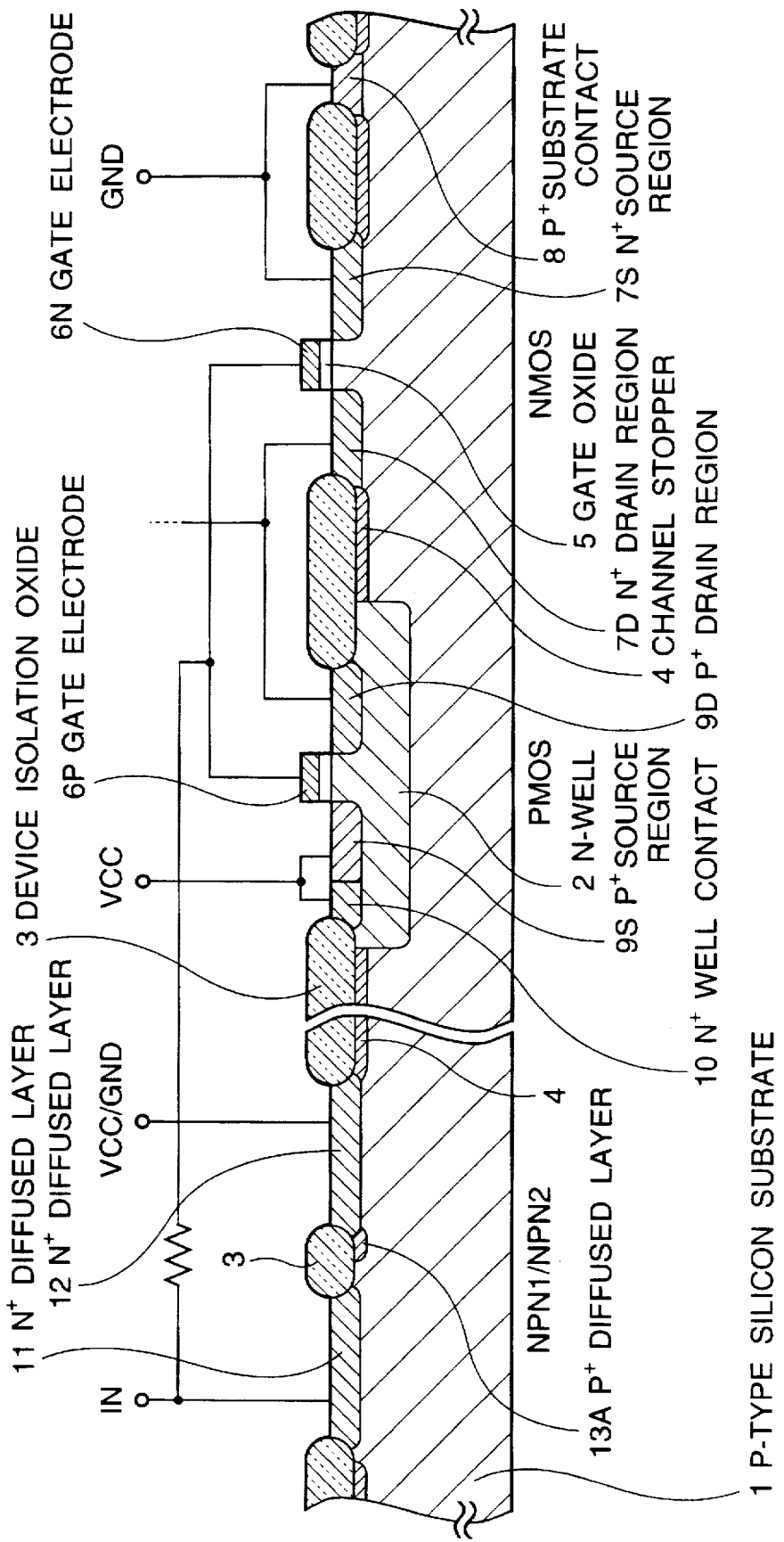

5,895,958

1

INPUT PROTECTION CIRCUIT FOR USE IN SEMICONDUCTOR DEVICE HAVING AN IMPROVED ELECTROSTATIC BREAKDOWN VOLTAGE

BACKGROUND OF THE INVENTION

1. Field of the Invention

The present invention relates to an input protection circuit for use in a semiconductor device, and more specifically to an input protection circuit comprising a protection device configured to absorb an electrostatic noise applied to a semiconductor circuit element by use of a bipolar action, and a protection resistor using a buffering effect based on R-C time constant of a resistance and a capacitance.

2. Description of Related Art

Referring to FIG. 1, there is shown a diagrammatic section view of an input part of a prior art semiconductor device. In addition, FIG. 2A is a layout pattern diagram of an input protection circuit in the prior art semiconductor device shown in FIG. 1, and FIG. 2B is a sectional view taken along the line X—X in FIG. 2A. FIG. 3 is a circuit diagram of the input part of a prior art semiconductor device shown in FIG. 1.

The prior art input protection circuit designated by Reference Numeral 100 in FIG. 3, comprises an input signal pad 15(IN) selectively coated on an interlayer insulator film 14 formed above a P-type silicon substrate 1, and a first bipolar protection device NPN1 constituted of a first $N^+$ diffused layer 11 connected through a contact hole CH1 to the input signal pad 15(IN) and formed at a surface portion of the P-type silicon substrate 1, and a second $N^+$ diffused layer 12 formed at the surface portion of the P-type silicon substrate 1, to extend in parallel to the first $N^+$ diffused layer 11 but separately from the first $N^+$ diffused layer 11 by a constant space, for example, 1.6 μm, a $P^+$ diffused layer 13 formed in the above mentioned space and joined to the first and second $N^+$ diffused layers 11 and 12 (this $P^+$ diffused layer 13 being also connected to a channel stopper 4), and a VCC power supply line 15(VCC) connected to the second $N^+$ diffused layer 12.

The input protection circuit 100 also includes a second bipolar protection device NPN2 which is formed similarly to the first bipolar protection device NPN1 but which is connected to a GND power supply line 15(GND) in place of the VCC power supply line 15(VCC), an input protection resistor R having a pair of $N^+$ diffused layers 10R selectively formed at a surface portion of opposite ends of a diffused layer 2R, which is formed simultaneously with an N-well 2 (a first terminal, which is composed of one of the pair of $N^+$ diffused layers 10R, is connected to the input signal pad 15(IN), and a second terminal, which is composed of the other of the pair of $N^+$ diffused layers 10R, is connected to an input signal internal wiring conductor 15(INA)).

The input protection circuit 100 further includes another protection device (BVds element) composed of a gate electrode 6B coated through a gate oxide film on a surface of the P-type silicon substrate 1, an $N^+$ drain region 7BD formed selectively on the surface portion of the P-type silicon substrate 1 and connected to the input signal internal wiring conductor 15(INA), and an $N^+$ source region 7BS formed selectively on the surface portion of the P-type silicon substrate 1 and connected to the gate electrode 6B through a contact hole CH2 and to the GND power supply line 15(GND).

If an electrostatic overvoltage is applied to the input signal pad 15(IN), the bipolar protection device NPN1 or

2

NPN2 exerts a bipolar transistor action to put the input voltage in a negative resistance region, so that the overvoltage is suppressed. Furthermore, a buffering caused by the time constant of a resistance of the input protection resistor R and its wiring capacitance, prevents an abrupt spike from reaching an internal circuit 200. Thus, the electrostatic overvoltage is prevented from being applied to the internal circuit 200.

As mentioned above, the bipolar protection device NPN1 and NPN2 of the prior art input protection circuit have the $P^+$ diffused layer 13 which is formed, for the purpose of improving the device isolation, between the $N^+$ diffused layer 11 connected to the input signal pad and the $N^+$ diffused layer 12 connected to the VCC power supply line or the GND power supply line. When a backward high voltage is applied to the $N^+$ diffused layer 11, hot carriers are generated in a depletion layer, and a portion of the generated hot carriers is injected into and accumulated in a device isolation oxide film 3. This is a cause for a leakage current.

In addition, since the thickness of the depletion layer of a $N^+P^+$ junction is narrow, a relatively high voltage cannot be ultimately applied. For example, under a condition prescribed under MIL-STD-883C, if the voltage applied to the input signal pad exceeds +600V in comparison with the VCC power supply line or the GND power supply line, the leakage current after this positive voltage is applied, becomes 0.1 μA or more.

As mentioned above, the prior art input protection circuit is disadvantageous in that the leakage current is easy to occur.

SUMMARY OF THE INVENTION

Accordingly, it is an object of the present invention to provide an input protection circuit for use in a semiconductor device, which has overcome the above mentioned defect of the prior art.

Another object of the present invention is to provide an input protection circuit for use in a semiconductor device, in which leakage current is significantly reduced.

The above and other objects of the present invention are achieved in accordance with the present invention by an input protection circuit for use in a semiconductor device, comprising:

an input signal pad selectively provided on an interlayer insulator film formed above a semiconductor substrate of a first conductivity type;

a bipolar protection device constituted of:

a first diffused layer of a second conductivity type opposite to the first conductivity type, the first diffused layer being connected to the input signal pad and formed selectively at a surface portion of the semiconductor substrate;

a second diffused layer of the second conductivity type formed at the surface portion of the semiconductor substrate, to extend in parallel to the first diffused layer but separately from the first diffused layer by a first space;

a third diffused layer of the first conductivity type formed in the semiconductor substrate in the first space to extend in parallel to the first and second diffused layers, in junction with the second diffused layer but separately from the first diffused layer, the third diffused layer having an impurity concentration higher than that of the surface portion of the semiconductor substrate; and a power supply line connected to the second diffused layer; and an input protection resistor having a first terminal connected to the input signal pad and a second terminal connected to an input signal internal wiring conductor.

With the above mentioned arrangement, since the semiconductor substrate region of the first conductivity type exists between the first diffused layer of the second conductivity type and the third diffused layer of the first conductivity type having the high impurity concentration, the thickness of a depletion layer generated in a reverse-biased condition is large, with the result that hot carriers rarely to occur.

In a preferred embodiment, the third diffused layer extends to cover a bottom and a side of the second diffused layer.

In addition, one bipolar protection device is connected between the input signal pad and a VCC power supply line, and another bipolar protection device is connected between the input signal pad and a GND power supply line.

Furthermore, another protection device can be provided, which includes a gate electrode coated through a gate oxide film on the surface of the semiconductor substrate, a drain region of the second conductivity type formed selectively on the surface of the semiconductor substrate and connected to the input signal internal wiring conductor, and a source region of the second conductivity type connected to the gate electrode.

In one embodiment, the input protection resistor can be formed of a diffused resistor.

The above and other objects, features and advantages of the present invention will be apparent from the following description of preferred embodiments of the invention with reference to the accompanying drawings.

BRIEF DESCRIPTION OF THE DRAWINGS

FIG. 4 is a diagrammatic section view of an input part of a semiconductor device, illustrating one embodiment of the input protection circuit in accordance with the present invention;

DESCRIPTION OF THE PREFERRED EMBODIMENTS

Figure 1:
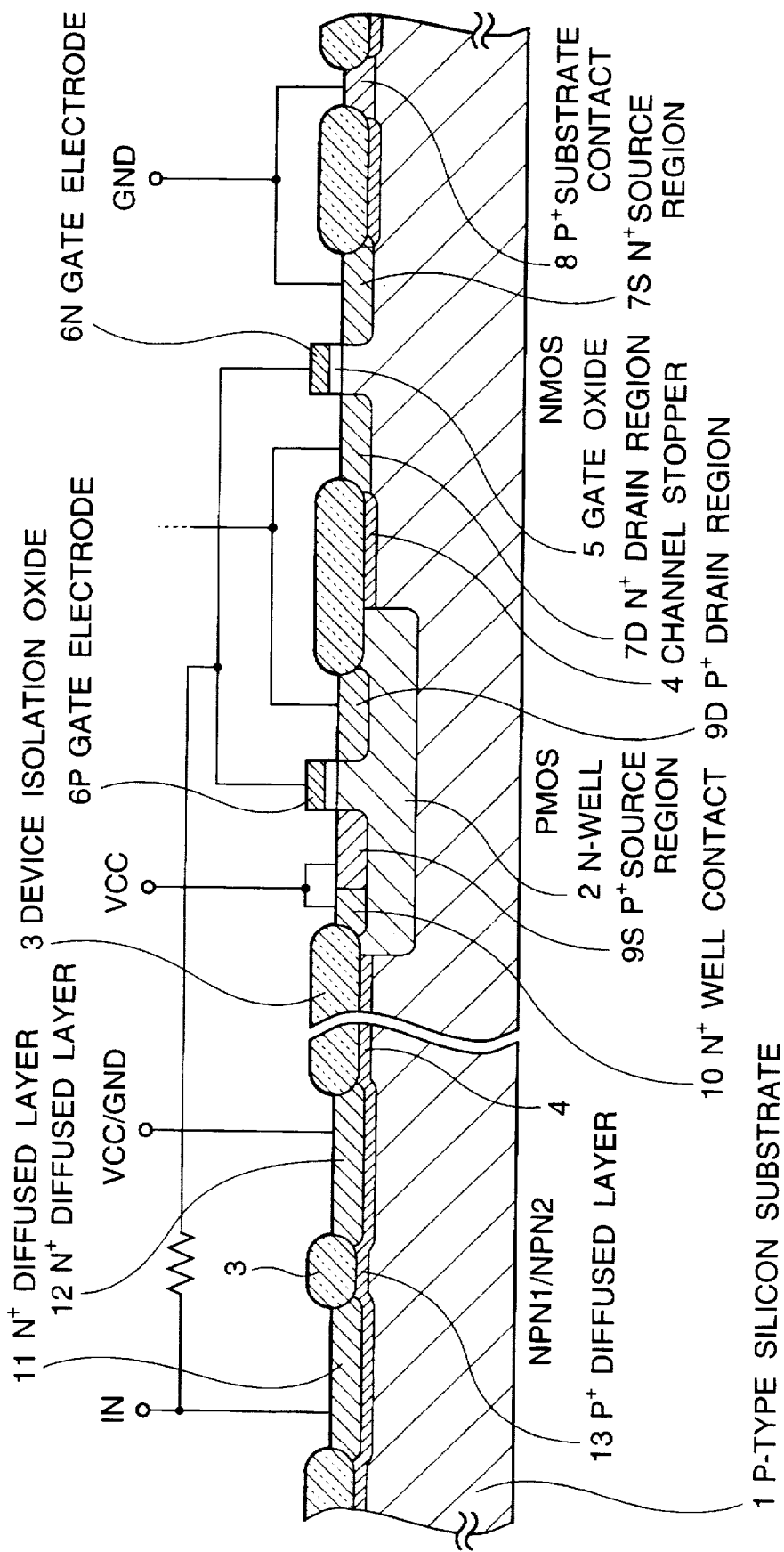
FIG. 1 is a diagrammatic section view of an input part of a prior art semiconductor device.
Figure 2A:
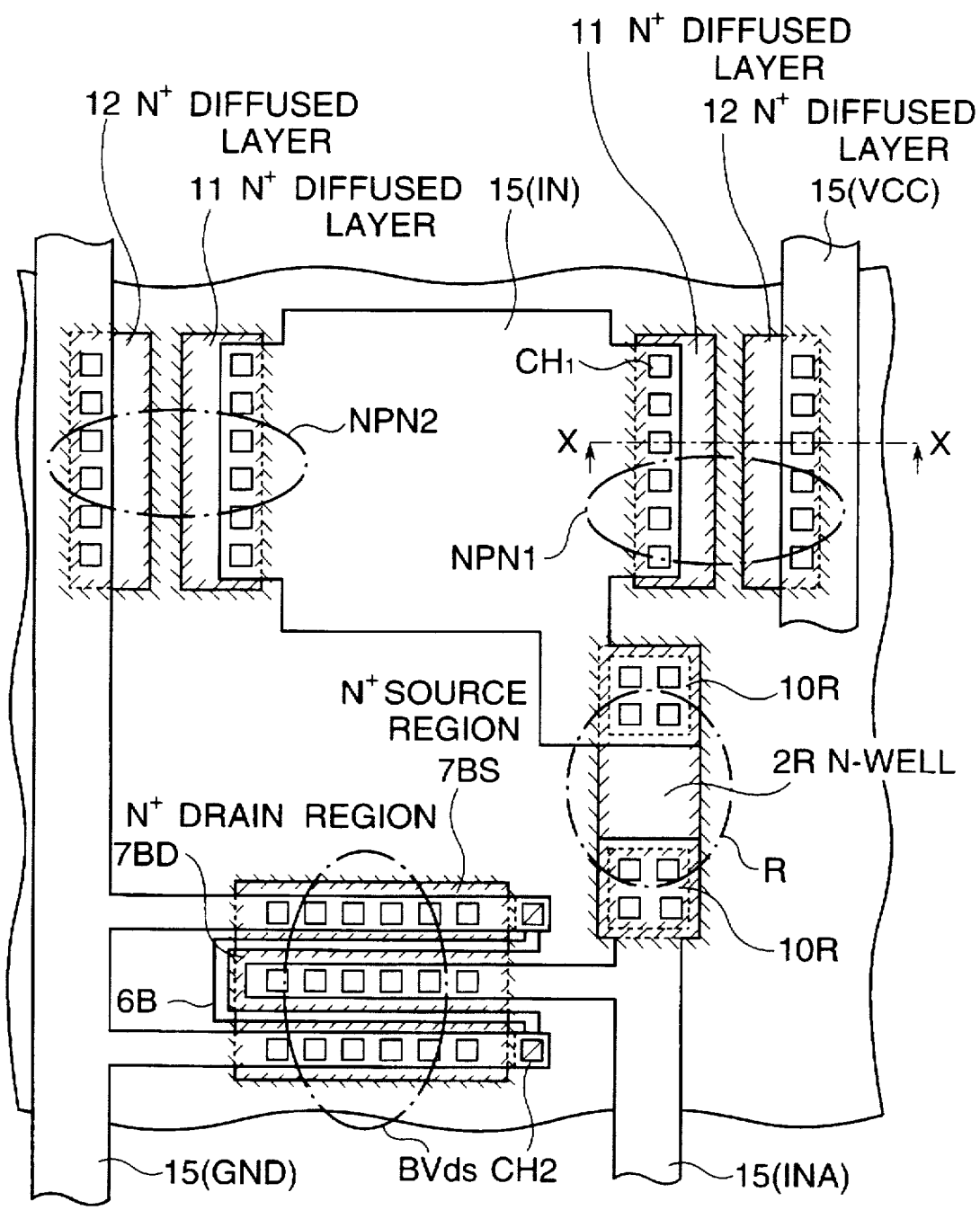
FIG. 2A is a layout pattern diagram of an input protection circuit in the prior art semiconductor device shown in FIG. 1.
Figure 2B:
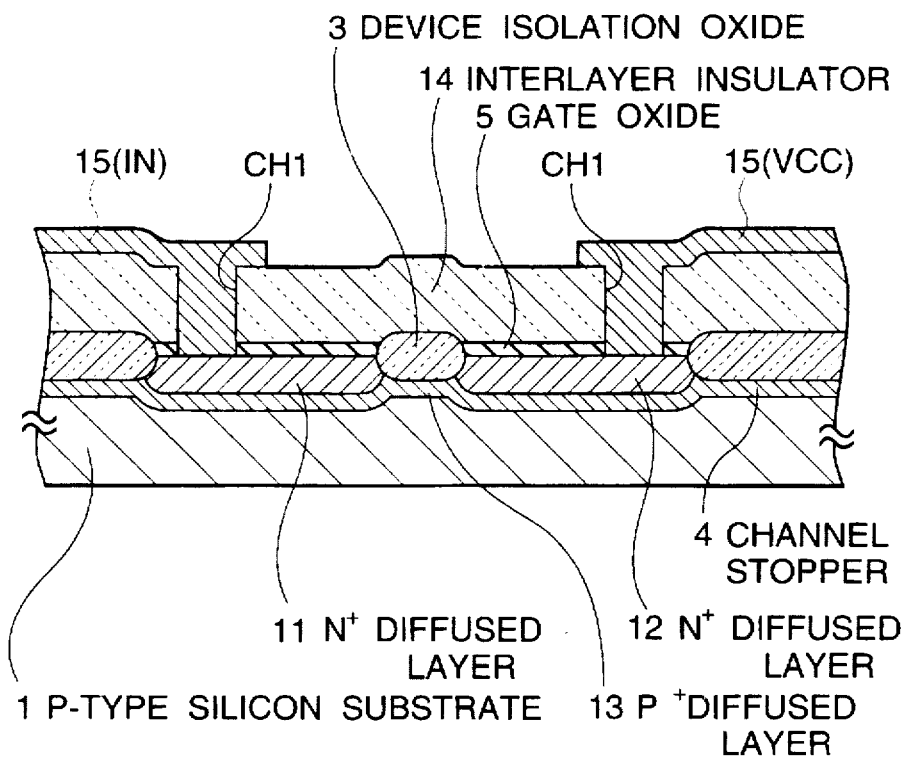
FIG. 2B is a sectional view taken along the line X—X in FIG. 2A.
Figure 3:
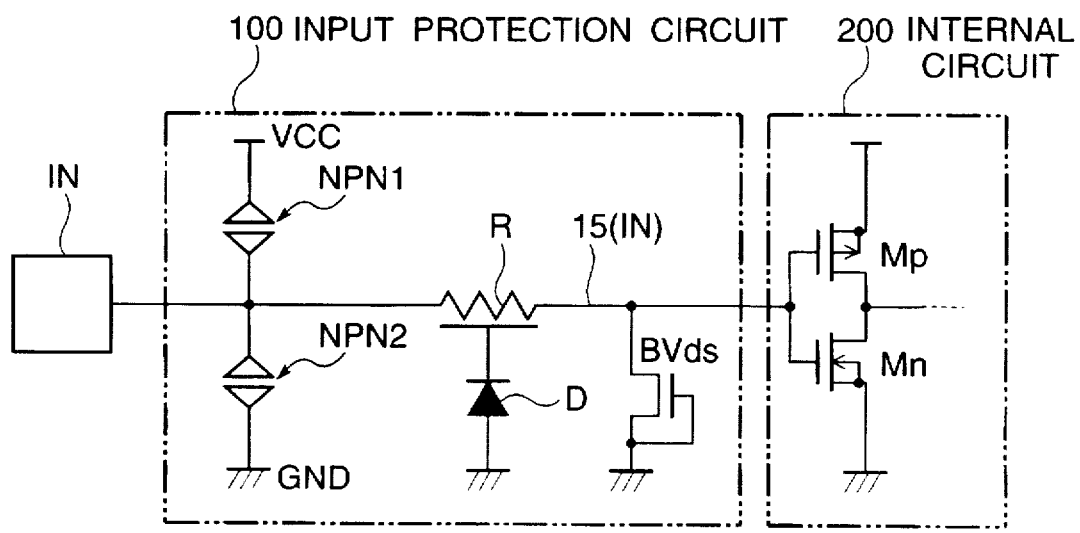
FIG. 3 is a circuit diagram of the input part of a prior art semiconductor device shown in FIG. 1.
Figure 5A:
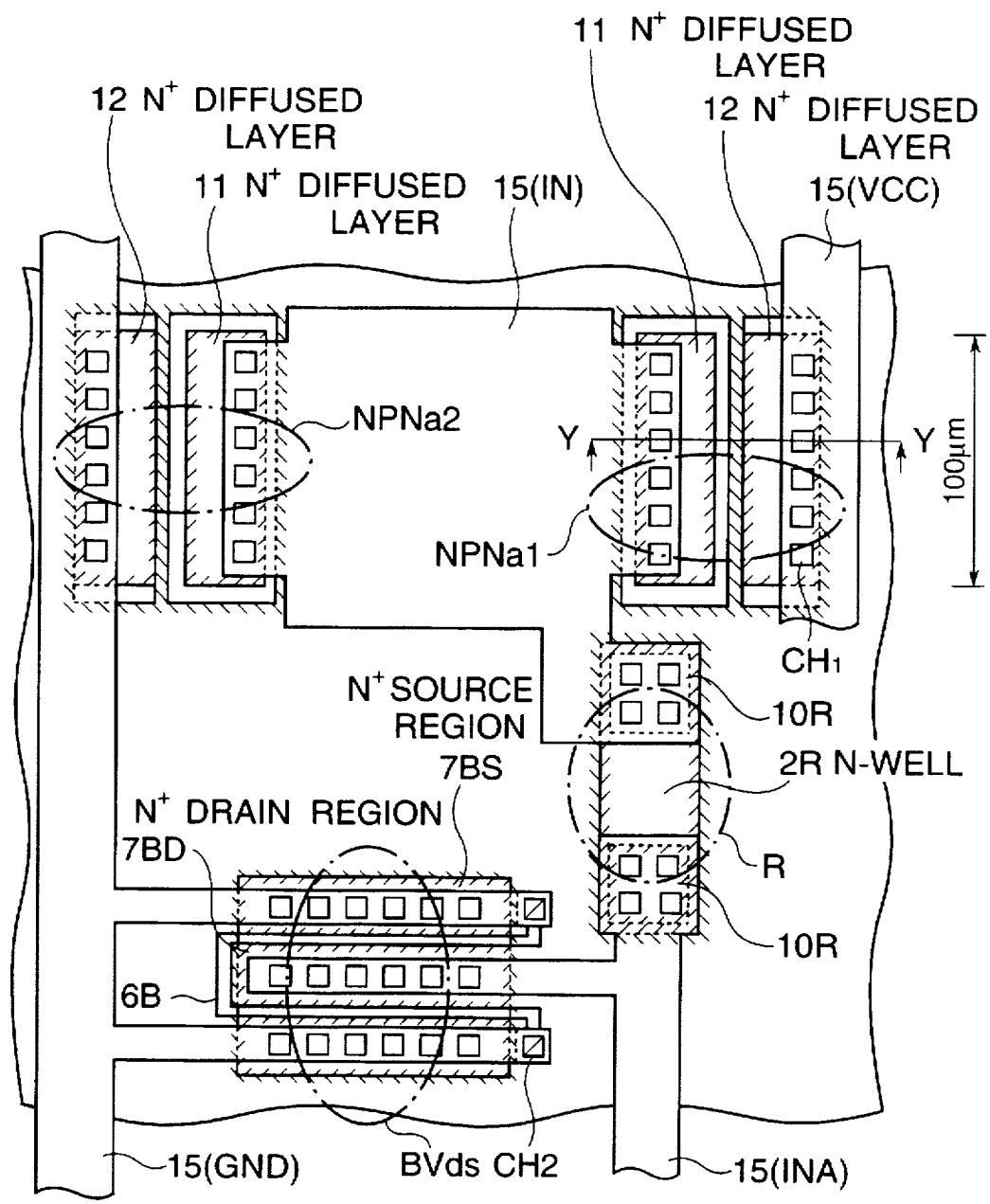
FIG. 5A is a layout pattern diagram of an input protection circuit in the semiconductor device shown in FIG. 4.
Figure 5B:
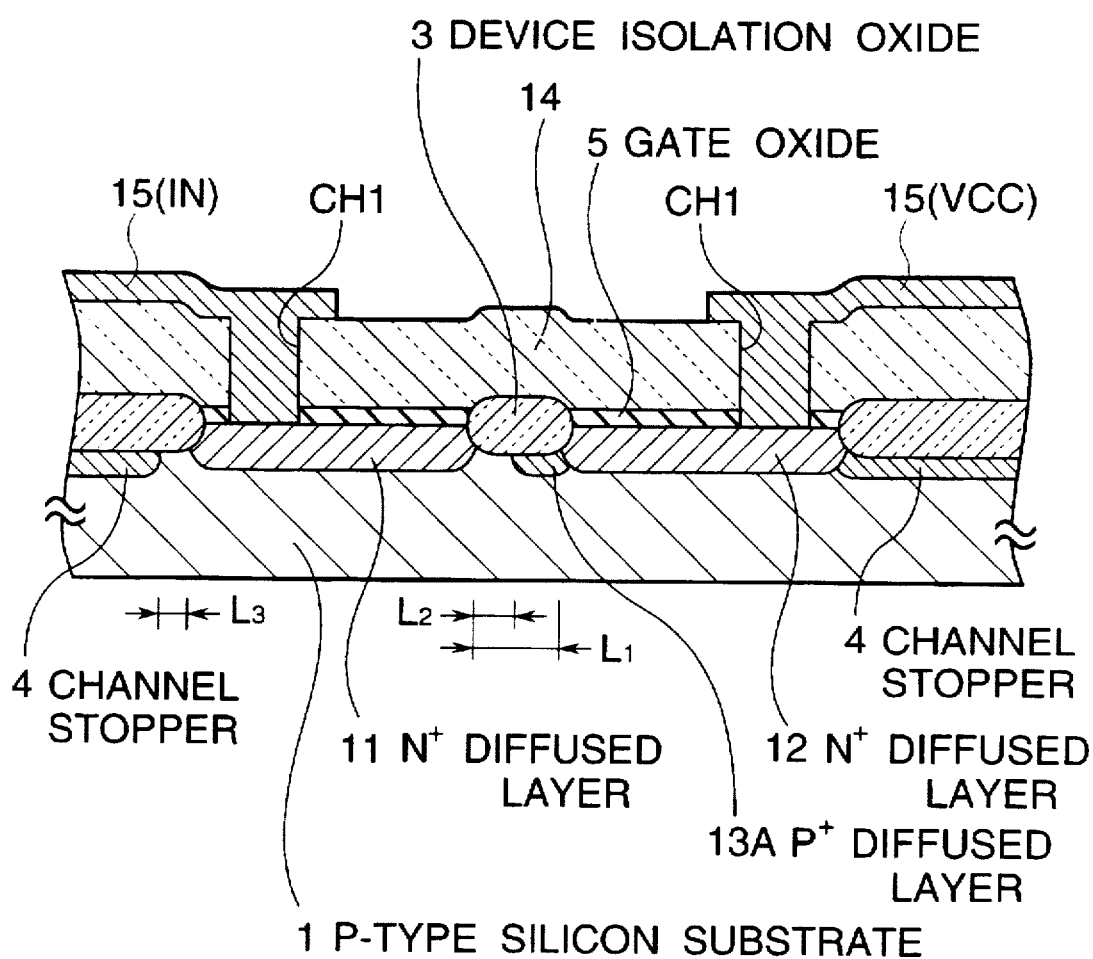
FIG. 5B is a sectional view taken along the line Y—Y in FIG. 5A.

Referring to FIG. 4, there is shown a diagrammatic section view of an input part of a semiconductor device, illustrating one embodiment of the input protection circuit in accordance with the present invention. FIG. 5A is a layout pattern diagram of an input protection circuit in the semiconductor device shown in FIG. 4, and FIG. 5B is a sectional view taken along the line Y—Y in FIG. 5A. In addition, FIG. 6 is a circuit diagram of the input part of the semiconductor device shown in FIG. 4.

Figure 6:
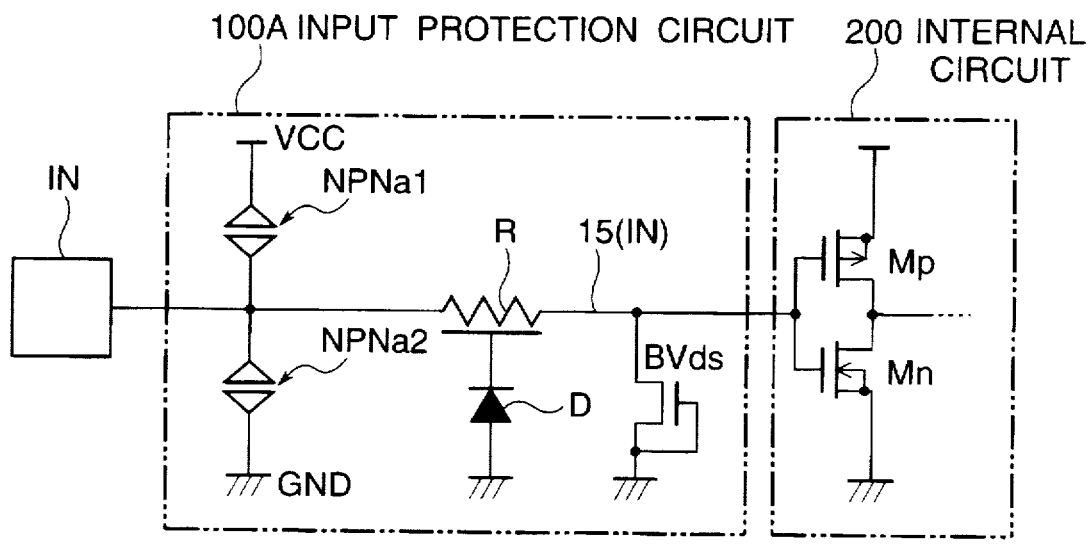
FIG. 6 is a circuit diagram of the input part of the semiconductor device shown in FIG. 4.

The shown input protection circuit designated by Reference Numeral 100A in FIG. 6, comprises a rectangular input signal pad 15(IN) formed of an aluminum alloy film 15 and selectively coated on an interlayer insulator film 14 formed above a P-type silicon substrate 1, and a first bipolar protection device NPNa1 constituted of a first $N^+$ diffused layer 11 connected through a contact hole CH1 to the input signal pad 15(IN) and formed at a surface portion of the P-type silicon substrate 1 in proximity of the input signal pad 15(IN) and to extend over a length of 100 μm along one side of the rectangular input signal pad, and a second $N^+$ diffused layer 12 formed at the surface portion of the P-type silicon substrate 1, to extend in parallel to the first $N^+$ diffused layer 11 but separately from the first $N^+$ diffused layer 11 by a constant space L1 of 1.6 μm, a $P^+$ diffused layer 13A having an impurity concentration higher than that of a surface portion of the P-type silicon substrate 1, and formed in the first space L1 to extend in parallel to the first and second $N^+$ diffused layers 11 and 12, in junction with the second $N^+$ diffused layer 12 but separately from the first $N^+$ diffused layer 11 by a second space L2 of 0.8 μm, and a VCC power supply line 15(VCC) connected to the second $N^+$ diffused layer 12 through a contact hole CH1.

Figure 10:
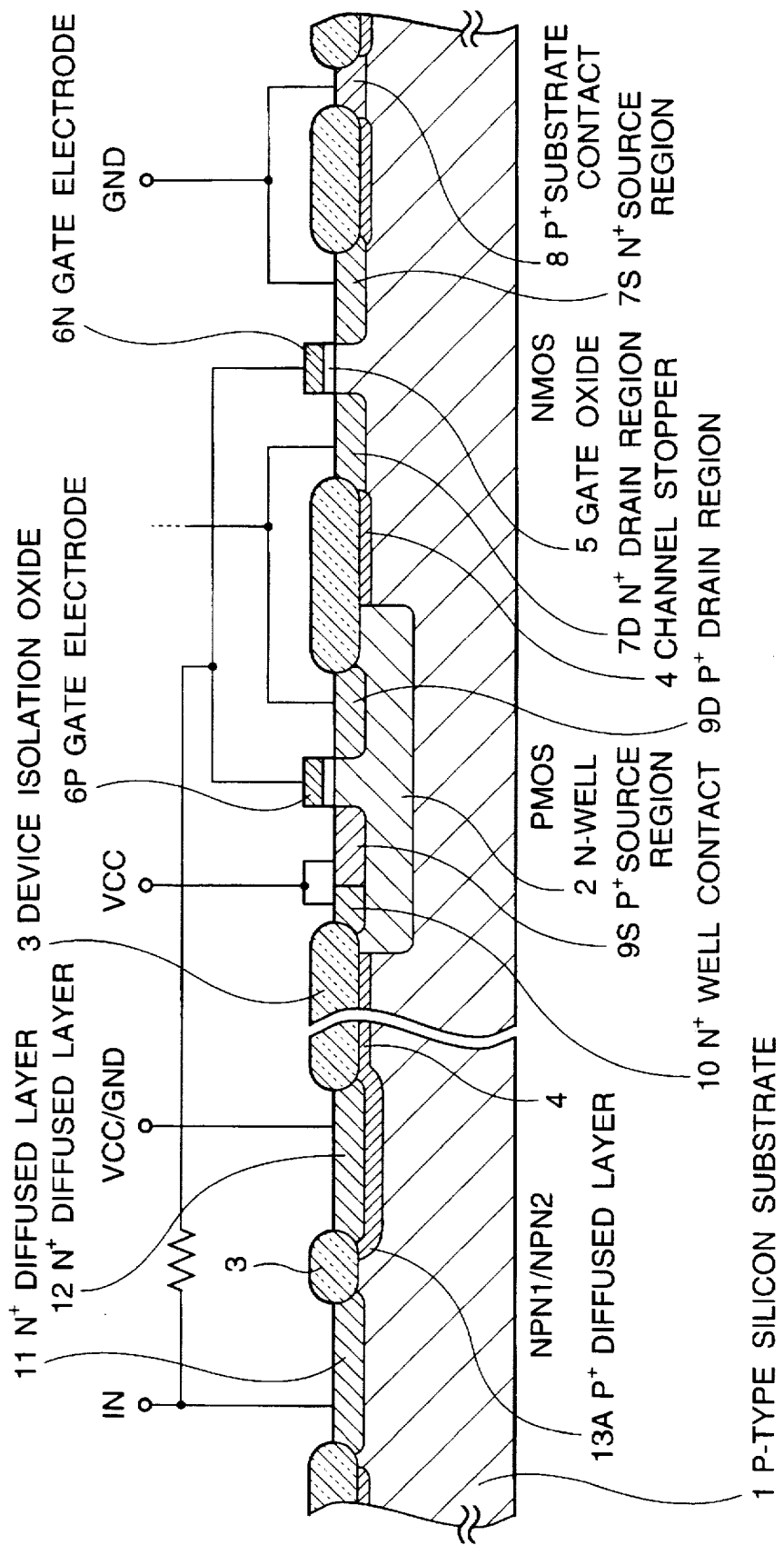
FIG. 10 is a diagrammatic section view similar to FIG. 4, but illustrating a modification of the embodiment shown in FIG. 4.
Figure 11A:
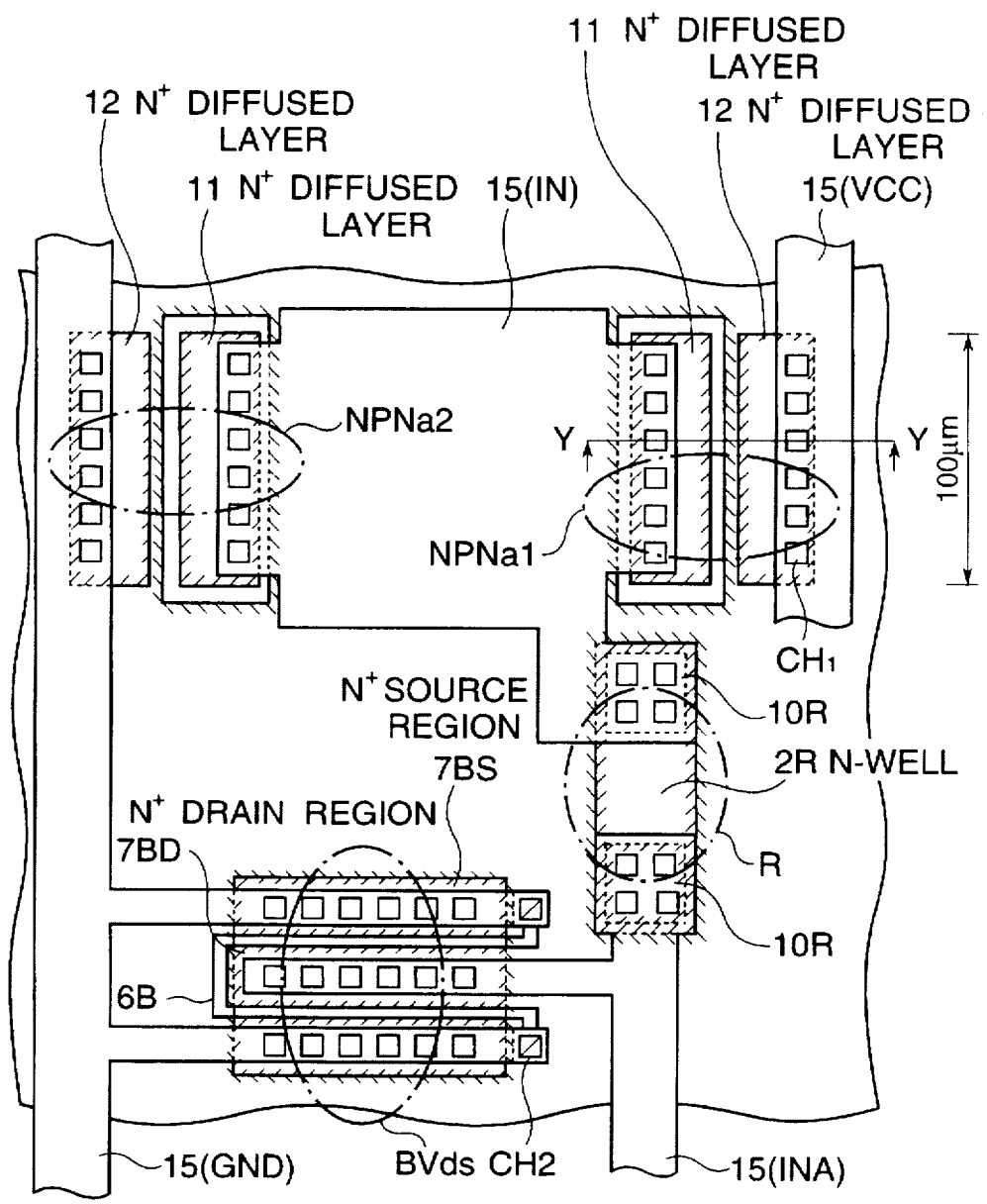
FIG. 11A is a layout pattern diagram similar to FIG. 5A, but illustrating an input protection circuit in the semiconductor device shown in FIG. 10.
Figure 11B:
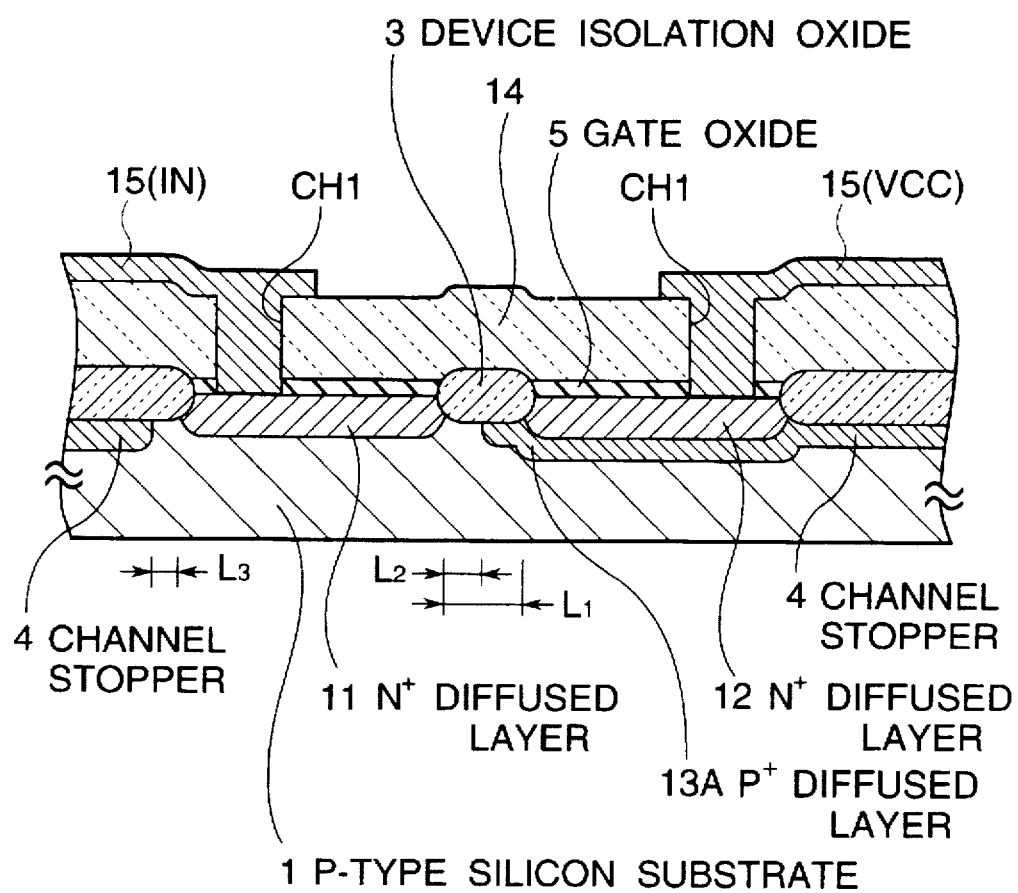
FIG. 11B is a sectional view taken along the line Y—Y in FIG. 10A.

In a modification, the $P^+$ diffused layer 13A can be formed to extend to cover a bottom and a side of the second $N^+$ diffused layer 12 as shown in FIGS. 10, 11A and 11B which are views similar to FIGS. 4, 5A and 5B, respectively but which illustrate the modification of the embodiment shown in FIGS. 4, 5A and 5B. In FIGS. 10, 11A and 11B, therefore, elements similar to those shown in FIGS. 4, 5A and 5B are given the same Reference Numerals, and further explanation will be omitted.

Furthermore, the input protection circuit 100A includes a second bipolar protection device NPNa2 which is formed similarly to the first bipolar protection device NPNa1 but which is connected between the input signal pad 15(IN) and a GND power supply line 15(GND).

The input protection circuit 100A also includes an input protection resistor R constituted of a diffused layer 2R which is formed in the substrate 1 and which has a pair of $N^+$ diffused layers 10R selectively formed at a surface portion of opposite ends of the diffused layer 2R. This diffused layer 2R is formed simultaneously with an N-well 2. One of the pair of $N^+$ diffused layers 10R, namely, one terminal of the input protection resistor R, is connected to the input signal pad 15(IN), and the other of the pair of $N^+$ diffused layers 10R, namely, the other terminal of the input protection resistor R, is connected to an input signal internal wiring conductor 15(INA).

The input protection circuit 100A further includes another protection device (BVds device) composed of a gate electrode 6B coated through a gate oxide film 5 on the surface of the P-type silicon substrate 1, an $N^+$ drain region 7BD formed selectively on the surface of the P-type silicon substrate 1 and connected to the input signal internal wiring conductor 15(INA), and an $N^+$ source region 7BS connected to the gate electrode 6B through a contact hole CH2 and to the GND power supply line 15(GND). Therefore, the BVds device has a MOS structure, and a W/L ratio (ratio of a channel width to a channel length) of this MOS structure is 200 µm/2 µm. The input signal internal wiring conductor 15(INA) is connected to an input of an internal circuit 200, for example, common-connected gates of a PMOS transistor Mp and an NMOS transistor Mn connected to form a CMOS inverter. The PMOS transistor Mp is formed of a $P^+$ source region 9S and a $P^+$ drain region 9D formed in the N-well 2 separately from each other and a gate electrode 6P formed on a gate oxide film 5 deposited on the surface of the N-well 2 between the source region 9S and a drain region 9D, as shown in FIG. 4. The NMOS transistor Mn is formed of an $N^+$ source region 7S and an $N^+$ drain region 7D formed in the P-type substrate 1 separately from each other and a gate electrode 6N formed on a gate oxide film 5 deposited on the surface of the substrate 1 between the source region 7S and a drain region 7D, as shown in FIG. 4.

In the above construction, a space L3 between the $N^+$ diffused layer 11 and the channel stopper 4 is made 0.8 µm or more. The $N^+$ diffused layers 11, 12 and 10R, the $N^+$ drain regions 7D and 7DB, the $N^+$ source regions 7S and 7SB, and a well contact region 10 are formed by for example the same ion implantation process and the same annealing process, and an impurity concentration of these portions is for example, $2.5 \times 10^{20}$ cm$^{-3}$. On the other hand, the $P^+$ diffused layer 13A is formed by an ion implantation and an annealing in the same process as that for forming the channel stopper 4, after the device isolation oxide film 3 is formed. An impurity concentration of the $P^+$ diffused layer 13A is for example, $6 \times 10^{16}$ cm$^{-3}$, and an impurity concentration of the P-type silicon substrate surrounding the $P^+$ diffused layer 13A is for example, $1 \times 10^{16}$ cm$^{-3}$.

Incidentally, Reference Numeral 8 designates a $P^+$ substrate contact region. A thickness of the gate oxide film 5 is on the order of 25 nm.

Now, an operation of this input protection circuit 100A will be described.

If a positive overvoltage as compared with a high power supply voltage (VCC) of the VCC power supply voltage line 15(VCC), is applied to the input pad 15(IN), a depletion layer extends from the $N^+$ diffused layer 11. However, since the $P^+$ diffused layer 13A exists between the $N^+$ diffused layers 11 and 12, a breakdown occurs before the depletion layer reaches the $N^+$ diffused layer 12. Thus, a large current flows by means of a bipolar transistor action. Here, the breakdown voltage is for example 22.5 V, but was 14.5 V in the prior art example. Therefore, by setting L2 to an appropriate value, the electric field intensity in the depletion layer can be made small, so that generation of hot carriers can be minimized, and accordingly, the increase of the leakage current caused because of application of the overvoltage can be also suppressed.

When a negative overvoltage as compared with the high power supply voltage (VCC) of the VCC power supply voltage line 15(VCC), is applied to the input pad 15(IN), there exist not only a $N^+P^+PN^+$ type transistor composed of the $N^+$ diffused layer 12, the $P^+$ diffused layer 13A, the P-type silicon substrate 1 and the $N^+$ diffused layer 11, but also a PN junction capacitor composed of the N-well and the P-type silicon substrate 1. Therefore, a load of the $N^+P^+PN^+$ transistor is lighter than the case that the positive overvoltage as compared with the high power supply voltage (VCC) is applied. On the other hand, the width of the depletion layer is comparable to that in the prior art example, but since the width of the $P^+$ diffused layer 13A is narrower than that of the $P^+$ diffused layer 13 in the prior art example, an effective base width is narrow, so that the bipolar transistor action is large.

When an overvoltage positive as compared with a ground voltage (GND) of the GND power supply voltage line 15(GND), is applied to the input pad 15(IN), an action occurs similarly to the case that the overvoltage positive as compared with the high power supply voltage (VCC) of the VCC power supply voltage line 15(VCC), is applied to the input pad 15(IN).

When a negative overvoltage, as compared with a ground voltage (GND) of the GND power supply voltage line 15(GND), is applied to the input pad 15(IN), there exists a PN junction capacitor composed of the $N^+$ source region 7S and the P-type silicon substrate 1. Not only does this capacitor exist in the shown inverter, but also a number of similar capacitors exist in the internal circuit. The load on of the second bipolar protection device NPNa2 is light, and in addition, the effective base width is narrow, similarly to the case that the negative overvoltage, as compared with the high power supply voltage (VCC) is applied.

Figure 7:
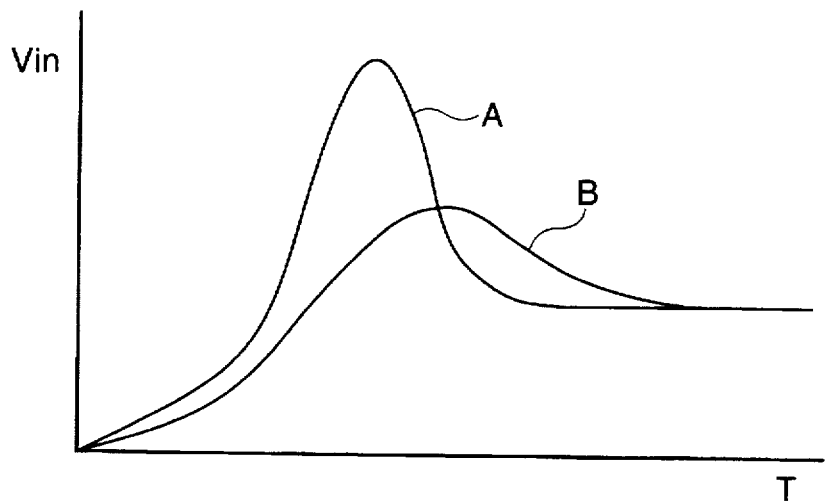
FIG. 7 is a graph illustrating a voltage buffering given by the input protection resistor.

Next, the input protection resistor R will be described. When a relatively high abrupt voltage spike is applied to the input signal pad, this abrupt spike is applied to the internal circuit 200 without modification if no input protection resistor R is provided. Therefore, as shown in the curved line A in FIG. 7, an input voltage Vin applied to the internal circuit 200 increases to a considerably high voltage with time, so that there is a possibility that a semiconductor circuit element fails before the input voltage Vin applied to the internal circuit 200 drops and becomes stable at a predetermined voltage. However, if the input protection resistor R is provided between the input signal pad 15(IN) and the internal circuit 200, the abrupt spike is buffered by the time constant of a resistance and a parasitic capacitance of the N-well 2R which constitutes the input protection resistor R, so that as shown in the curved line B in FIG. 7, a peak value of the input voltage Vin applied to the internal circuit 200 can be made small. Incidentally, Reference Character "D" in FIG. 6 designates a PN junction diode formed between the N-well 2R and the P-type silicon substrate 1.

Now, an operation of the BVds device will be described.

When a positive overvoltage, as compared with a ground voltage (GND) of the GND power supply voltage line 15(GND), is applied to the input pad 15(IN), the BVds device exhibits a negative resistance, as well known in the art, so that the BVds device becomes conductive. On the other hand, when a negative overvoltage, negative as compared with the ground voltage (GND) is applied, the BVds device behaves as an MOS transistor.

Figure 8:
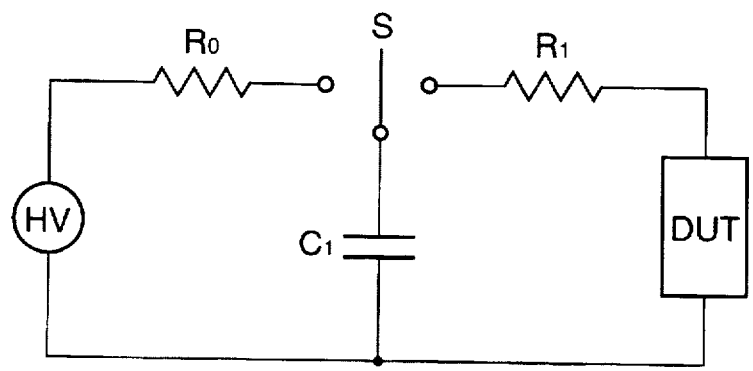
FIG. 8 is a circuit diagram illustrating an electrostatic breakdown test.

Referring to FIG. 8, there is shown a circuit diagram illustrating an electrostatic breakdown test.

First, the test procedure prescribed under MIL-452-883C will be described with reference to FIG. 8. A predetermined voltage is supplied from a high voltage power supply HV through a resistor R0 of 10M Ω and a switch S to a capacitor C1 of 100 pF for a time period of 50 ms, and thereafter, the switch S is changed over so that an electric charge stored in the capacitor C1 is applied through a resistor R1 of 1.5K Ω to a device under test DUT for a time period of 100 ms. This operation is repeated five times.

The following TABLE 1 shows the result of the test of the first embodiment as mentioned above and the prior art example.

TABLE 1

| | MIL-STD-883C | | | |
|---|---|---|---|---|
| condition | {I} | {II} | {III} | {IV} |
| Prior Art | 600 V | 600 V | 2400 V | 600 V |
| 1st Embodiment | ≧4000 V | 3800 V | ≧4000 V | ≧4000 V |

The voltage conditions {I}, {II}, {III} and {IV} are as follows:

{I} A voltage positive as compared with the GND power supply terminal is applied.

{II} A voltage positive as compared with the VCC power supply terminal is applied.

{III} A voltage negative as compared with the GND power supply terminal is applied.

{IV} A voltage negative as compared with the VCC power supply terminal is applied.

In the above TABLE 1, the voltage condition is to be understood that, for example, 600 V means that, after the above mentioned electrostatic breakdown test was conducted with a predetermined voltage, when 7 V, 0 V and 7 V are applied to the VCC power supply terminal, the GND power supply terminal and the input signal terminal connected to the input signal pad, respectively, the current flowing through the input signal terminal (namely, the leakage current) is less than 0.1 µA if the predetermined voltage mentioned above was not greater than 600 V. In this connection, it is to be noted that, before the electrostatic breakdown test is conducted, the measured leakage current is far smaller than 0.1 µA. In addition, if the gate oxide film of the inverter shown in FIG. 6 is broken down, the leakage current of far larger than 0.1 µA is observed.

It will be noted that the electrostatic breakdown voltage of the first embodiment greatly elevates as compared with the prior art example.

Now, the test procedure prescribed under E1AJ ED-4701 will be described. In this case, in the circuit shown in FIG. 8, the capacitor C1 is of 200 pF, the resistor R0 is of 10M Ω, and the resistor R1 is of 0 Ω. An operation of charging the capacitor C1 for 100 ms and discharging the capacitor C1 to a device under test DUT for 100 ms, is repeated five times.

The following TABLE 2 shows the result of the test of the first embodiment and the prior art example, obtained by conducting this electrostatic breakdown text and thereafter measuring the leakage current under the above mentioned condition.

TABLE 2

| | E1AJ ED-4701 | | | |
|---|---|---|---|---|
| condition | {I} | {II} | {III} | {IV} |
| Prior Art | 200 V | 100 V | 300 V | 100 V |
| 1st Embodiment | 400 V | 400 V | 1300 V | 700 V |

The voltage conditions {I}, {II}, {III} and {IV} are the same as {I}, {II}, {III} and {IV} in TABLE 1.

In the result of this test, the embodiment is greatly improved as compared with the prior art example.

Incidentally, a high voltage on the order of 12 V is used in a so called flash memory. For this purpose, some semiconductor devices has a circuit construction capable of designating an operation mode by applying a mode setting signal of 12 V or more or less through a predetermined input signal terminal. In this circuit construction, the breakdown voltage of about 14.5 V in the bipolar protection device in the prior art cannot be said to have a sufficient margin. Therefore, use of this circuit construction was a problem. However, since the breakdown voltage in the bipolar protection device of this embodiment is of about 22.5 V, it is possible to provide the above mentioned mode setting terminal with a sufficient operational margin.

Figure 9:
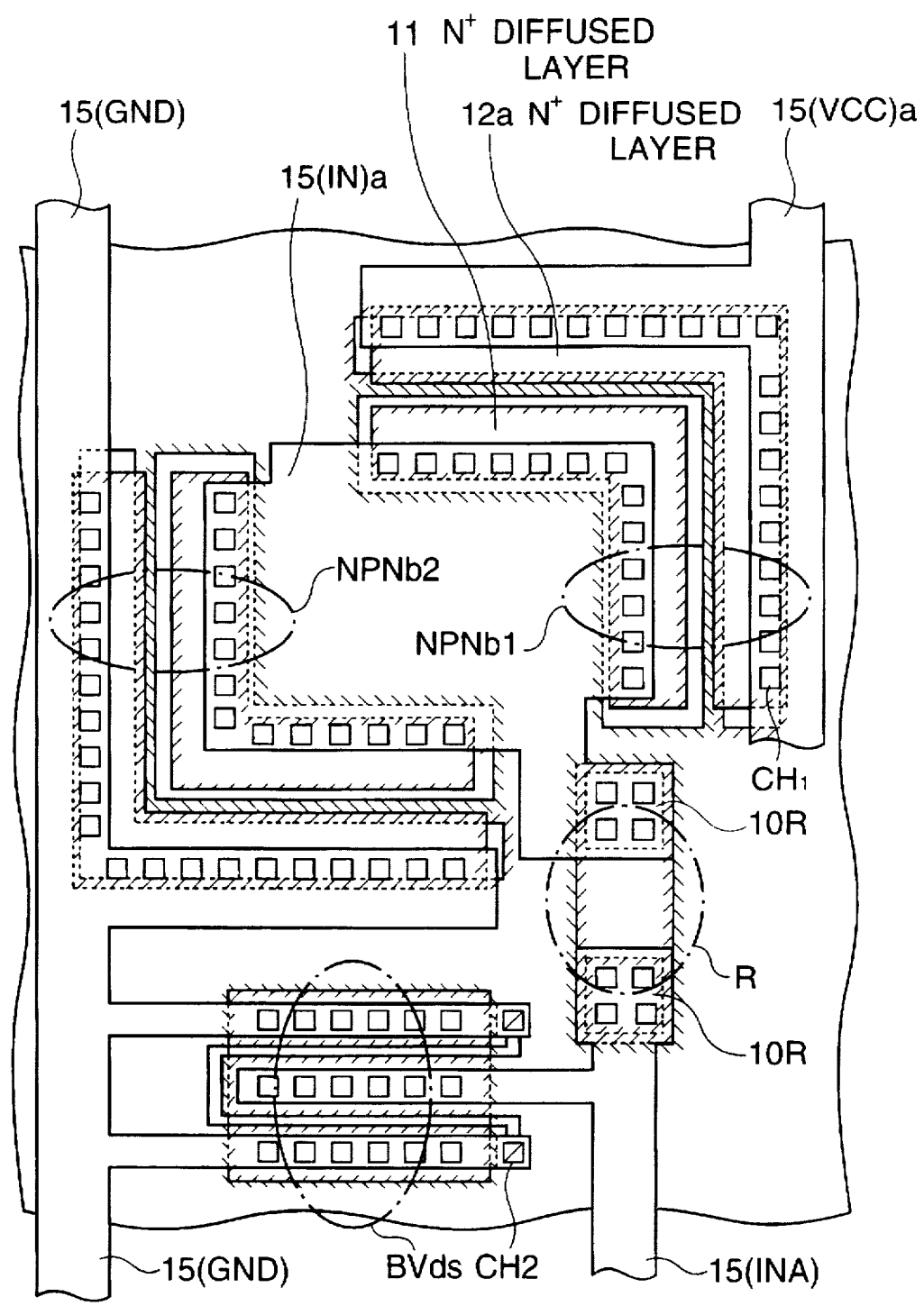
FIG. 9 is a layout pattern diagram of another embodiment of the input protection circuit in accordance with the present invention.

Referring to FIG. 9, there is shown a layout pattern diagram of another embodiment of the input protection circuit in accordance with the present invention. In FIG. 9, elements similar to those shown in FIG. 5A are given the same Reference Numerals, and explanation thereof will be omitted for simplification of description.

This second embodiment is the same as the first embodiment, excepting that first and second bipolar protection devices NPNb1 and NPNb2 are formed sufficiently larger than the first and second bipolar protection devices NPN1 and NPN2 of the first embodiment.

Specifically, N$^+$ diffused layers 11A and 12A extend along two sides of the input signal pad 15(IN) containing one corner therebetween, so that a length of the PP$^+$ region put between the N$^+$ diffused layers 11A and 12A is about two and half times the length of the PP$^+$ region in the first embodiment. Therefore, since a larger current is allowed to flow, the protection capability can be elevated.

Figure 12:
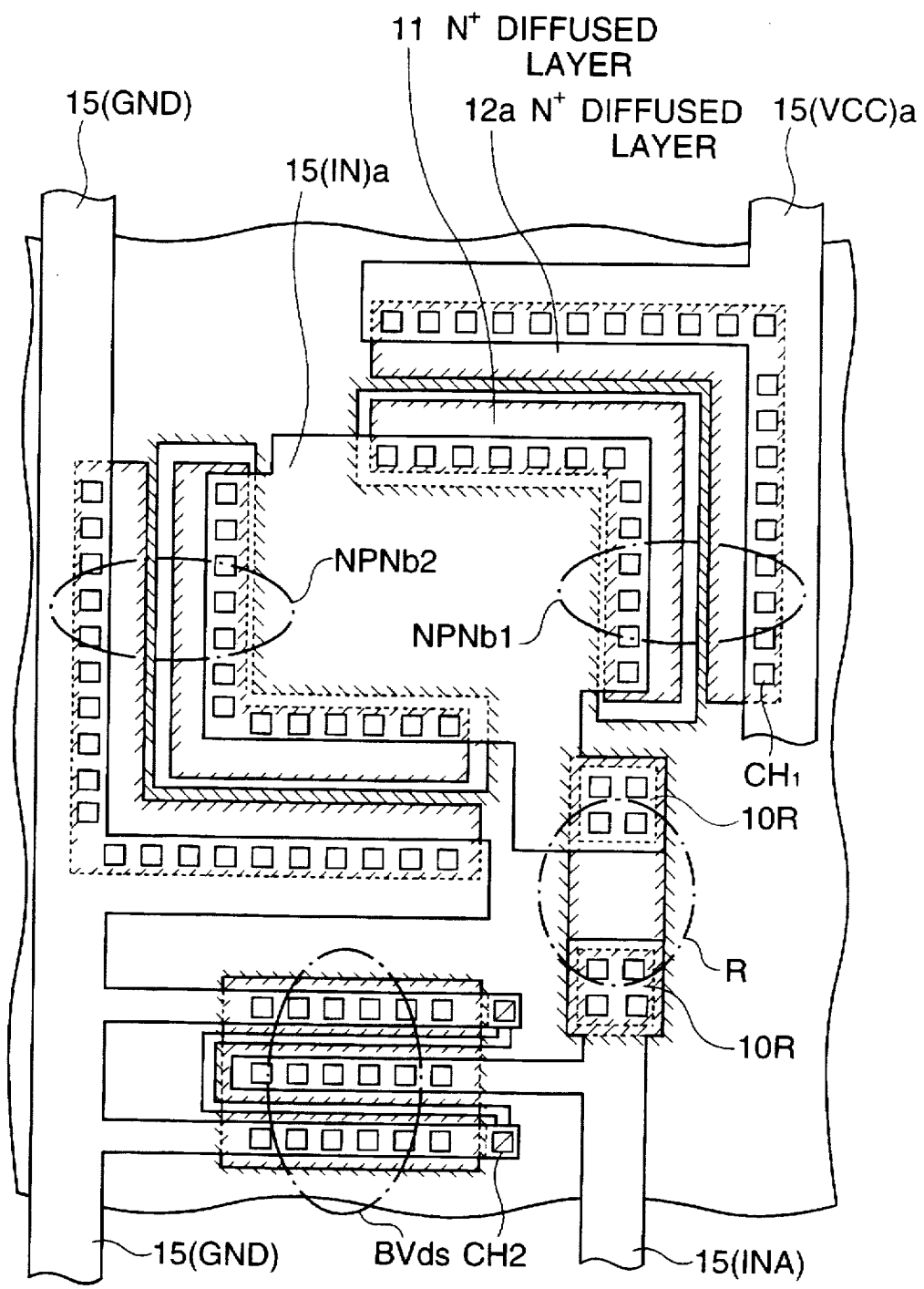
FIG. 12 a layout pattern diagram similar to FIG. 9, but illustrating a modification of of the embodiment shown in FIG. 9.

In a modification, the P$^+$ diffused layer 13A can be formed to extend to cover a bottom and a side of the second N$^+$ diffused layer 12 as shown in FIG. 12 which is a view similar to FIG. 9, respectively but which illustrates the modification of the embodiment shown in FIG. 9. In FIG. 9, therefore, elements similar those shown in FIG. 9 are given the same Reference Numerals, and further explanation will be omitted.

In the above mentioned embodiments, the BVds device has been provided in addition to the bipolar protection devices and the protection resistor. However, it does not necessarily follow that the BVds device must be omitted. The reason for this is that: the BVds device functions as either the negative resistance element or the MOS transistor dependently upon the polarity of the applied voltage, but the bipolar protection devices in accordance with the present invention are the negative resistance element exerting the bipolar transistor action regardless of the polarity of the applied voltage, although there is a slight operational difference.

Furthermore, the bipolar protection devices in accordance with the present invention and the protection resistor can be formed in a conventional CMOS process, and therefore, it is not necessary to add a special process.

As seen from the above, the input protection circuit in accordance with the present invention is characterized in that the bipolar protection device is constituted of a first diffused layer of the second conductivity type connected to the input signal pad, a second diffused layer of the second conductivity type formed to extend in parallel to the first diffused layer but separately from the first diffused layer by a first space, and a third diffused layer of a high impurity concentration and of the first conductivity type formed in the first space to extend in parallel to the first and second diffused layers, in junction with the second diffused layer but separately from the first diffused layer.

With this construction, since the semiconductor substrate region of the first conductivity type (having a low impurity concentration) exists between the first diffused layer of the second conductivity type and the third diffused layer of the first conductivity type having the high impurity concentration, when an electrostatic overvoltage is applied to the input terminal, the thickness of a depletion layer generated in a mode in which almost of the current flows through only the bipolar protection device, is large, with the result that hot carriers are hard to generate. In another mode in which the current flows through not only the bipolar protection device but also other paths, an effective base width can be reduced, so that the protection capability can be elevated. Accordingly, the increase of the leakage current caused because of application of an overvoltage, is prevented, so that the electrostatic breakdown voltage can be improved.

The invention has thus been shown and described with reference to the specific embodiments. However, it should be noted that the present invention is in no way limited to the details of the illustrated structures but changes and modifications may be made within the scope of the appended claims.

I claim:

1. An input protection circuit for use in a semiconductor device, comprising:
    an input signal pad selectively coated on an interlayer insulator film formed above a semiconductor substrate of a first conductivity type;
    a bipolar protection device constituted of:
        a first diffused layer of a second conductivity type opposite to said first conductivity type, said first diffused layer being connected to said input signal pad and formed selectively at a surface portion of said semiconductor substrate;
        a second diffused layer of said second conductivity type formed at said surface portion of said semiconductor substrate, to extend in parallel to said first diffused layer but separated from said first diffused layer by a first space;
        a third diffused layer of said first conductivity type formed in said semiconductor substrate in said first space to extend in parallel to said first and second diffused layers, in junction with said second diffused layer but separately from said first diffused layer, said third diffused layer having an impurity concentration higher than that of said surface portion of said semiconductor substrate,
        wherein said third diffused layer extends to cover a bottom and a side of said second diffused layer; and
    a power supply line connected to said second diffused layer; and
    an input protection resistor having a first terminal connected to said input signal pad and a second terminal connected to an input signal internal wiring conductor.

2. An input protection circuit claimed in claim 1, wherein said input signal pad has at least one linear sides, and said first diffused layer is formed along said one side of said input signal pad, substantially over a full length of said side.

3. An input protection circuit claimed in claim 1 wherein said input signal pad has at least two linear sides, and said first diffused layer is formed along said two sides of said input signal pad containing therebetween a corner of said pad, substantially over a full length of each of said two sides.

4. An input protection circuit claimed in claim 1 further including a further protection device which includes a gate electrode coated over a gate oxide film on said surface of said semiconductor substrate, a drain region of said second conductivity type formed selectively on said surface of said semiconductor substrate and connected to said input signal internal wiring conductor, and a source region of said second conductivity type connected to said gate electrode.

5. An input protection circuit claimed in claim 1 wherein said input protection resistor is formed of a diffused resistor.

6. An input protection circuit for use in a semiconductor device, comprising:
    an input signal pad selectively coated on an interlayer insulator film formed above a semiconductor substrate of a first conductivity type;
    a bipolar protection device constituted of:
        a first diffused layer of a second conductivity type opposite to said first conductivity type, said first diffused layer being connected to said input signal pad and formed selectively at a surface portion of said semiconductor substrate;
        a second diffused layer of said second conductivity type formed at said surface portion of said semiconductor substrate, to extend in parallel to said first diffused layer but separated from said first diffused layer by a first space;
        a third diffused layer of said first conductivity type formed in said semiconductor substrate in said first space to extend in parallel to said first and second diffused layers, in junction with said second diffused layer but separated from said first diffused layer, said third diffused layer having an impurity concentration higher than that of said surface portion of said semiconductor substrate, wherein said third diffused layer of each of said first named bipolar protection device and said second bipolar protection device extends to cover a bottom and a side of said second diffused layer; and
    a power supply line connected to said second diffused layer; and
    an input protection resistor having a first terminal connected to said input signal pad and a second terminal connected to an input signal internal wiring conductor,
    wherein said bipolar protection device is connected between said input signal pad and a power supply line, and a second bipolar protection device having the same structure as that of said bipolar protection device, is connected between said input signal pad and a ground line.

7. An input protection circuit claimed in claim 6 wherein said input signal pad is rectangular and said first diffused layer of said first named bipolar protection device is formed along a first side of the rectangle of said input signal pad substantially over a full length of said first side, and said first diffused layer of said second bipolar protection device is formed along a second side of the rectangle of said input signal pad opposite to said first side of the rectangle substantially over a full length of said second side.

8. An input protection circuit claimed in claim 6 wherein said input signal pad is rectangular, and said first diffused layer of said first named bipolar protection device is formed along first and second sides of the rectangle of said input signal pad containing therebetween a first corner thereof, substantially over a full length of each of said first and second sides, and said first diffused layer of said second bipolar protection device is formed along third and fourth sides of said input signal pad, containing therebetween a second corner thereof diagonal to said first corner substantially over a full length of each of said third and fourth sides.

* * * * *

UNITED STATES PATENT AND TRADEMARK OFFICE
CERTIFICATE OF CORRECTION

PATENT NO.    : 5,895,958
DATED         : April 20, 1999
INVENTOR(S)   : Atsunori MIKI It is certified that error(s) appears in the above-identified patent and that said Letters Patent is hereby corrected as shown below:

Column 2,    line 17,    delete "hor" and insert --hot--;

Column 4,    line 4,    delete the second occurrence of "of";

Column 6,    line 25,    delete "of".

Signed and Sealed this

Fourteenth Day of December, 1999

Attest:

Q. TODD DICKINSON

Attesting Officer    Acting Commissioner of Patents and Trademarks